United States Patent [19]

Scott

[11] 4,075,508
[45] Feb. 21, 1978

[54] I²L INJECTOR CURRENT SOURCE
[75] Inventor: Paul Howard Scott, Tempe, Ariz.
[73] Assignee: Motorola, Inc., Schaumburg, Ill.
[21] Appl. No.: 738,778
[22] Filed: Nov. 4, 1976
[51] Int. Cl.² .................. H03K 19/08; H03K 19/40
[52] U.S. Cl. .................. 307/213; 307/214;
307/299 B; 307/303; 357/44; 357/46
[58] Field of Search .............. 307/213, 214-215,
307/299 B, 303; 357/44, 46

[56] References Cited
U.S. PATENT DOCUMENTS

| 3,564,281 | 2/1971 | Tokunaga et al. ............ 307/214 |
| 3,913,123 | 10/1975 | Masaki et al. ............ 357/46 X |

Primary Examiner—John Zazworsky
Attorney, Agent, or Firm—Joe E. Barbee

[57] ABSTRACT

A switchable injector current source for integrated injection logic (I²L) circuits is provided. An I²L gate having an NPN output transistor with at least two collectors is used to drive an emitter follower. A resistor is connected from the emitter of the emitter follower to one of the collectors of the NPN transistor. The base of the emitter follower is connected to the other collector of the NPN transistor and is also connected to a current source. The output of the switchable injector current source is taken from the junction formed by the collector of the NPN transistor and the resistor.

6 Claims, 5 Drawing Figures ated 4,075,508

I²L INJECTOR CURRENT SOURCE

BACKGROUND OF THE INVENTION

This invention relates to semiconductor circuits, and more particularly, relates to providing a switchable injector current source for those semiconductor circuits known as integrated injection logic (I²L) circuits.

I²L circuits offer high packing density, low power dissipation, and relatively good speed. For reasons of cost and reliability, attempts are being made to accommodate a maximum number of circuit components on a single chip. Not only does I²L offer the high packing density but it also offers relatively low cost processing. Some of the items that consume a considerable amount of semiconductor area on a chip are the diffused resistors which require a very great area, components which must be isolated from other components on the same chip, and metal lines which are used to interconnect the different components on the chip. When isolating partial circuits from each other the isolation must extend through the whole expitaxial layer down to the substrate. In addition, to the isolation diffusion width tolerance problems caused by the special masking step detrimentally affect the packing densities obtainable. Moreover the diffusion operation entails additional time and process requirements and leads to reduced yields in many cases. It is therefore preferable to group several circuit components within one isolation pocket. It will therefore be appreciated that it would be desirable to utilize circuitry that is compatible with the high packing density of I²approaches and yet uses a minimum number of metal lines to interconnect the different circuits.

Accordingly it is an object of this invention to provide a switchable injector current source which is compatible with the high density approach of I²L technology.

Another object of this invention is to provide a switchable injector current source which permits a relatively reduced die size because of the reduction of metal line routing.

Yet another object of the present invention is to provide a switchable injector current source which can drive several nodes from a single line.

SUMMARY OF THE INVENTION

In carrying out the above and other objects of the invention in one form, I provide an improved switchable injector current source which is compatible with I²L technology. One illustrated form of the switchable current source has an I²L gate wherein the output transistor of the I²L has at least two collector outputs. Means for providing a resistance wherein the means has a first and a second end are also used. An NPN transistor is provided having a base, emitter, and a collector. The base of the NPN transistor is coupled to one of the collectors of the I²L gate while the emitter of the NPN transistor is coupled to one end of the means for providing the resistance. The other end of the means for providing a resistance is coupled to the other of the collector outputs of the I²L gate.

The subject matter which I regard as my invention is set forth in the appending claims. The invention itself, however, together with further objects and advantages thereof, may be better understood by referring to the following detailed description taken in conjunction with the accompanying drawings.

The exemplifications set out herein illustrate the preferred embodiments of the invention in one form thereof, and such exemplifications are not to be construed as limiting in any manner.

DESCRIPTION OF THE PREFERRED EMBODIMENTS

Figure 1:
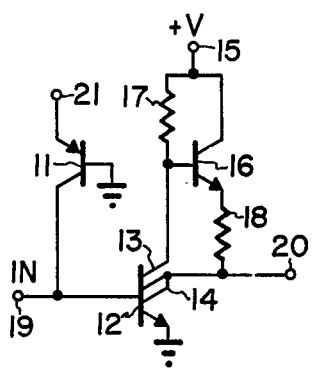
FIG. 1 illustrates in schematic diagram form one embodiment of the invention.

Referring first to FIG. 1, therein is shown a PNP transistor 11 having a grounded base and a collector which is physically a common semiconductor region as the base of an associated NPN transistor 12. The emitter of transistor 12 is grounded and is physically a common region of a semiconductor material as the base of transistor 11. Transistor 12 has split collectors 13 and 14. It will be noted that transistors 11 and 12 form a fairly commonly known type of I²L gate. Transistor 12 is illustrated schematically as having three collectors wherein two of them are tied together to form a single collector 14. The purpose of illustrating collector 14 in this manner is to indicate that collector 14 has a larger semiconductor area than does collector 13. Collector 13 is tied to the base of a transistor 16. The emitter of transistor 16 is tied to a resistor 18 while the other end of resistor 18 is connected to collector 14. The junction of resistor 18 and collector 14 form an output 20. The collector of transistor 16 is connected to a terminal 15 which is a terminal connection for a positive DC voltage. Resistor 17 is connected between the base of transistor 16 and voltage terminal 15. Resistor 17 must be of a sufficient ohmic value to serve as a current source for the base of transistor 16.

The emitter follower 16 and resistor 18 along with resistor 17 can be placed within the same isolation region of the semiconductor chip thereby conserving chip area.

Figure 2:
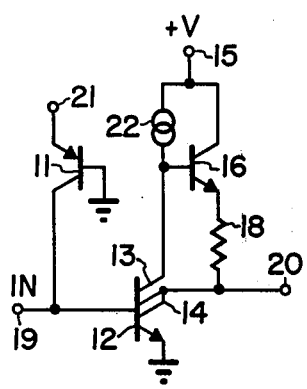
FIG. 2 illustrates schematically a modified form of the circuitry of FIG. 1.

The circuitry of FIG. 2 is similar to the circuitry shown in FIG. 1 with the exception that resistor 17 in FIG. 1 has been replaced by current source 22 in FIG. 2. Diffused resistors typically require a very great area of semiconductor material and therefore are generally avoided hence, it is preferable to avoid the use of too many resistors. Current source 22 can easily be formed on a semiconductor chip by two transistors as is well known by those skilled in the art. Output 20 can be controlled by controlling the base drive on transistor 16. The preferred way of controlling output 20 is by way of input 19. When input 19 is a logic high, transistor 12 will conduct heavily thereby placing collectors 13 and 14 at approximately the same potential as the emitter of transistor 12. The emitter of transistor 12 is at ground reference potential. When the input on input 19 is a logic "0" then transistor 12 is nonconductive and current can flow throgh transistor 16 and resistor 18 to output 20. Another way to control output 20 would be to controllably place the base of transistor 16 at ground reference potential. Yet another way to control the output 2 would be to switch on and off the injector current source input for transistor 11. This injector current input is through the emitter 21 of transistor 11.

Figure 3:
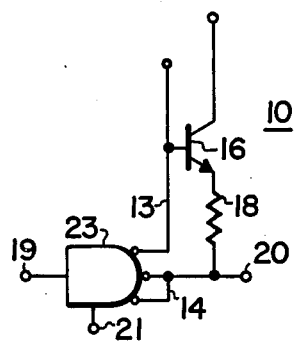
FIG. 3 illustrates part in schematic and part in logic diagram form the embodiment of the invention of FIGS. 1 and 2.

FIG. 3 illustrates in logic diagram form transistors 11 and 12 as logic gate 23. Logic gate 23 has logic input 19, injector current input 21, collector 13, and collector 14. Once again logic gate 23 is illustrated as having three separate collector outputs wherein two of them are connected together to form collector output 14. The semiconductor area of collector 14 may be larger than the area for collector 13 since collector 14 must serve as a current sink for the current flowing through resistor 18 to output 20. Collector 13 need only serves as a current sink for the base current of transistor 16 which is generally much less than the current for output 20. The smaller the collector area for collector 14 the longer it would take for collector 14 to sink the current in all of the elements of the gates that would be tied to output 20. The end result is that the smaller the semiconductor area for collector 14 then the slower is the turn off time of the device.

Figure 4:
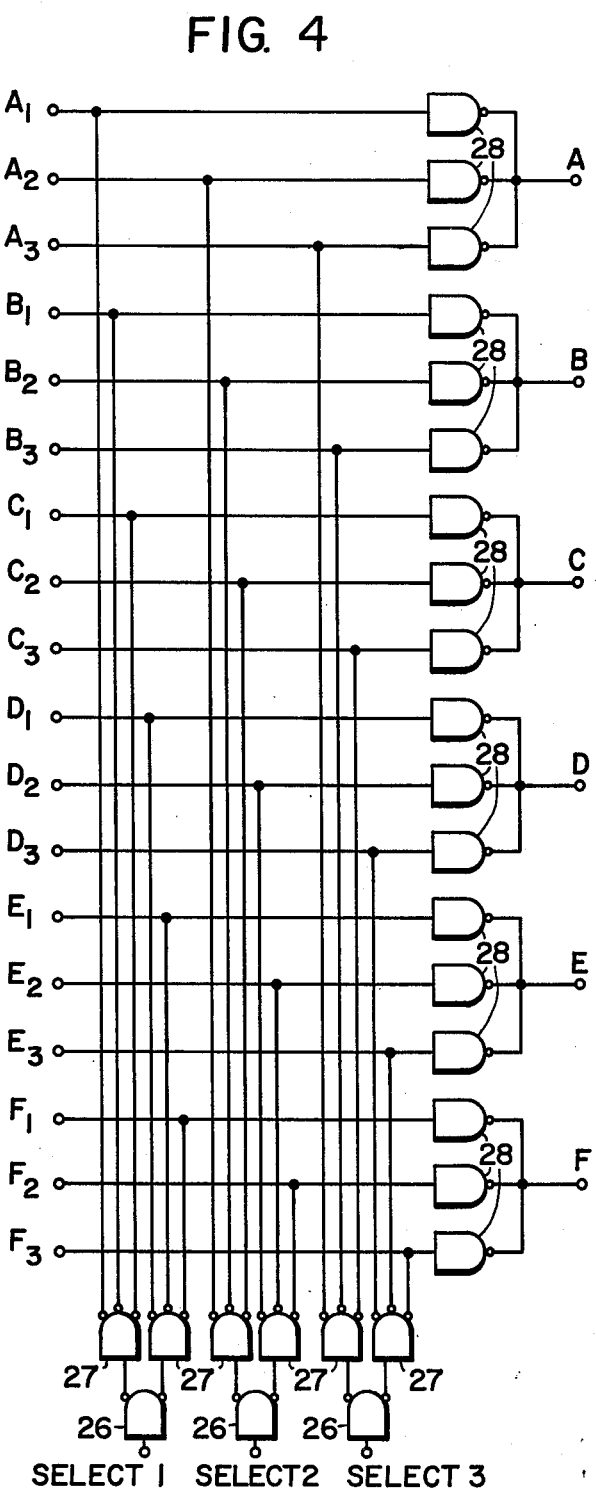
FIG. 4 illustrates in logic diagram form one of the problems caused by more conventional implementation of a data multiplexer.

FIG. 4 illustrates the congestion of metal lines on a semiconductor chip that is overcome by the present invention. Three I²L gates 26 each have two outputs. Each output of I²L gates 26 drives another I²L gate 27 having three outputs. Each output of I²L gate 27 requires a connection to the line which it is controlling. Such a connection normally entails providing a metal line along the surface of the semiconductor chip to make the connection. As can be seen in the circuit illustrated, 18 such lines would be required since there are six I²L gates 27 each having three outputs apiece. If a larger array of logic gates were required, then the number of metal lines required would become the limiting factor. Each output of gate 27 controls the inputs to an I²L gate 28 having a single output. I²L gates 28 are arranged in groups of three wherein the output of three gates 28 are tied together to form one output. As an example in the top row, output A is the NOR function of inputs $A_1$, $A_2$, and $A_3$.

Figure 5:
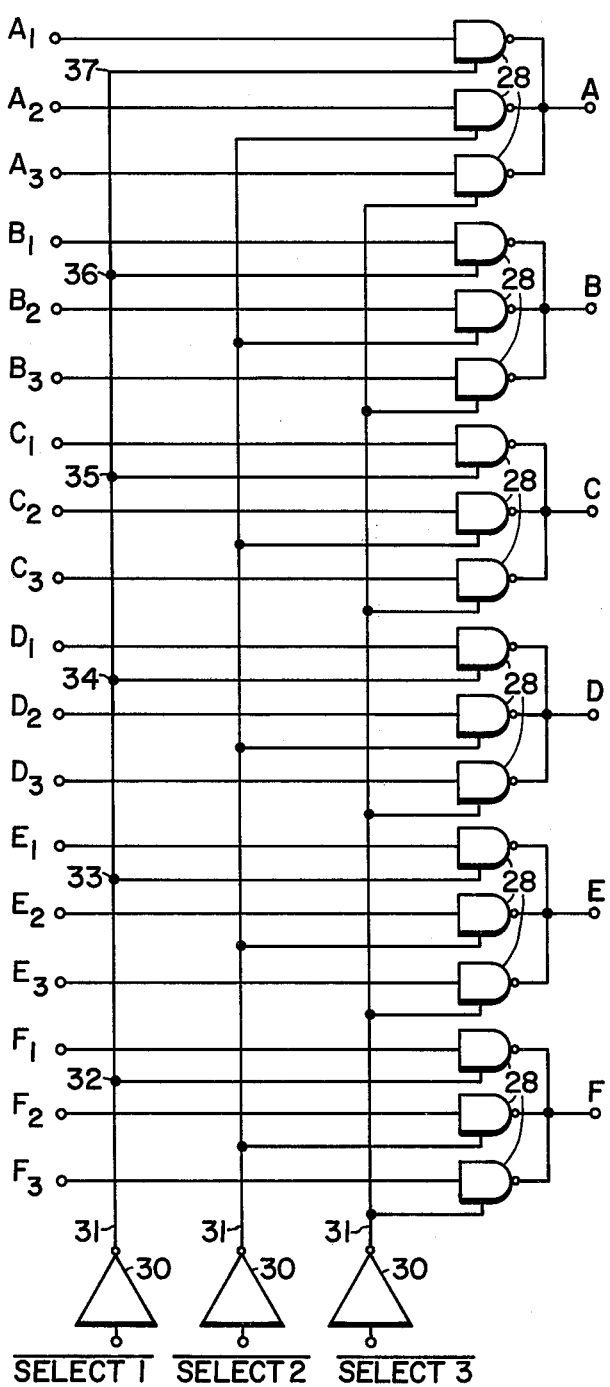
FIG. 5 illustrates in logic diagram form an application of the present invention.

FIG. 5 illustrates the reduction of the number of metal lines from the circuitry shown in FIG. 4. In FIG. 5 three injector gates or semiconductor switchable injector current sources 30 are shown each having a single output. This single output has one metal line 31 connecting it to I²L gate 28 wherein each metal line has multiple nodes. Each node 32-37 goes to a different I²L gate 28. OF course, it will be understood by those persons skilled in the art that lines 31 are placed over the circuit elements so that nodes such as nodes 32 to 37 are the connection between the metal line and the appropriate circuit element.

It should be noted that the output of selectable current sources or injector gates 30 control the injector inputs to logic gates 28 instead of controlling the logic inputs as was done in the circuitry of FIG. 4. Thus injector current gates 30 are current supplies for I²L gates 28 and control the function of gates 28 as did I²L gates 26 and 27 of FIG. 4.

My co-pending application Ser. No. 738,779 filed on Nov. 4, 1976 and entitled, "Buffering for an I²L Memory Cell" illustrates a use for the present invention. The co-pending application is hereby incorporated herein by reference.

By now it should be recognized that I have provided a circuit that does, among other things, control the function of a great number of I²L gates. I have also provided a circuit which requires a smaller die size because of the reduced metal routing. My circuitry also provides a single line that has the capability of driving multiple nodes.

Consequently, while in accordance with the Patent Statutes, I have described what at present I consider to be the preferred forms of my invention. It will be obvious to those skilled in the art that numerous changes and modifications may be made herein without departing from the spirit and scope of the invention, and it is therefore aimed in the following claims to cover all such modifications.

What I claim as new and desire to secure by Letters Patents of the United States is:

1. An injector gate for use with an integrated injection logic semiconductor circuit, comprising: an I²L gate having an NPN transistor with at least two collectors; means for providing a resistance, the means having a first and a second end; and an NPN transistor having a base, emitter, and collector, the base of the NPN transistor being coupled to one of the at least two collectors and the emitter being coupled to the first end of the means, the second end of the means being coupled to the other of the at least two collectors.

2. The injector gate of claim 1 wherein the other of the at least two collectors is larger in semiconductor material area than the one of the at least two collectors.

3. A switchable injector current source, comprising: an integrated injection logic gate having an input and at least a first and a second output; means to provide a resistance having a first and a second end, the first end being electrically coupled to the first output of the logic gate; and a transistor having a base, collector, and emitter, the emitter being electrically coupled to the second end of the means to provide, and the base being electrically coupled to the second output of the logic gate, an output of the switchable injector current source being at the first end of the means to provide, the output of the switchable injector current source being controllable by the input to the logic gate.

4. The switchable injector current source of claim 3 wherein the first and second output of the logic gate are provided by first and second collectors respectively and further wherein the first controller is larger in semiconductor material area than the second collector.

5. A semiconductor switchable injector current source for integrated injection logic circuits, comprising: a PNP transistor having a grounded base, an emitter and a collector; a first NPN transistor having a base, a grounded emitter and split collectors wherein one of the split collectors has a greater semiconductor region than the other split collector; the base being in common to the collector of the PNP transistor; a resistor having a first and a second end, the first end coupled to the split collector having a greater semiconductor region thereby forming a output junction; and a second NPN transistor having a base, a collector, and an emitter wherein the base is coupled to the other split collector and the emitter is coupled to the second end of the resistor.

6. The semiconductor switchable injector current source of claim 5 wherein the base of the second NPN and the other split collector are coupled to a current source.

* * * * *